(12) United States Patent
Liu et al.

(10) Patent No.: US 12,366,274 B2
(45) Date of Patent: Jul. 22, 2025

(54) METHODS OF PRODUCING COMPOSITE VEHICLE BRAKING COMPONENTS INCLUDING ALUMINUM ALLOYS

(71) Applicant: GM GLOBAL TECHNOLOGY OPERATIONS LLC, Detroit, MI (US)

(72) Inventors: Zhongyi Liu, Troy, MI (US); Heewook Lee, Oakland Township, MI (US); Anil K. Sachdev, Rochester Hills, MI (US); Tyson Whittier Brown, Royal Oak, MI (US); Ratandeep Singh Kukreja, Auburn Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 428 days.

(21) Appl. No.: 18/090,553

(22) Filed: Dec. 29, 2022

(65) Prior Publication Data

US 2024/0218909 A1 Jul. 4, 2024

(51) Int. Cl.
| | |
|---|---|
| *F16D 65/12* | (2006.01) |
| *C23C 16/06* | (2006.01) |
| *C23C 16/40* | (2006.01) |
| *C23C 16/455* | (2006.01) |
| *C23C 28/00* | (2006.01) |
| *F16D 65/10* | (2006.01) |

(52) U.S. Cl.
CPC .......... *F16D 65/125* (2013.01); *C23C 16/06* (2013.01); *C23C 16/405* (2013.01); *C23C 16/45529* (2013.01); *C23C 28/3455* (2013.01); *F16D 65/10* (2013.01); *F16D 2200/003* (2013.01); *F16D 2200/0039* (2013.01); *F16D 2250/0007* (2013.01); *F16D 2250/0046* (2013.01)

(58) Field of Classification Search
CPC ....... F16D 2200/003; F16D 2200/0039; F16D 2200/0017; F16D 2250/0046; F16D 65/10; F16D 2065/132
See application file for complete search history.

(56) References Cited

U.S. PATENT DOCUMENTS

| | | | | |
|---|---|---|---|---|
| 5,629,101 | A | * | 5/1997 | Watremez ............. F16D 65/125 188/251 A |
| 2020/0309222 | A1 | * | 10/2020 | Müller .................. F16D 69/027 |
| 2021/0017629 | A1 | * | 1/2021 | Liu ............................ C22F 1/04 |
| 2024/0019007 | A1 | * | 1/2024 | Lee ........................ C22C 38/06 |
| 2024/0209908 | A1 | * | 6/2024 | Lee .......................... F16D 65/10 |
| 2024/0344575 | A1 | * | 10/2024 | Liu ........................ C22C 38/02 |

* cited by examiner

*Primary Examiner* — David R Morris

(57) ABSTRACT

A method of manufacturing a brake rotor or brake drum having a composite structure includes casting an aluminum alloy to form a core of the brake rotor or brake drum, the core defining a core surface, depositing a high entropy alloy or yttrium stabilized zirconia on the core surface to form a thermal barrier layer on the core surface, and depositing an iron-aluminum-silicon-zirconium alloy on the thermal barrier layer to form a wear-resistant layer on the thermal barrier layer, the wear-resistant layer defining a friction surface of the brake rotor or brake drum.

20 Claims, 8 Drawing Sheets

METHODS OF PRODUCING COMPOSITE VEHICLE BRAKING COMPONENTS INCLUDING ALUMINUM ALLOYS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure generally relates to methods of producing composite vehicle braking components including aluminum alloys and, more particularly, to using atomic layer deposition to produce a thermal barrier layer of a composite vehicle braking component.

Vehicle braking components may be mounted on a rotatable axle of the vehicle, which may be coupled to a wheel of the vehicle. During baking, a friction surface of the vehicle braking component may contact a brake pad, which engages the friction surface to slow or stop rotation of the vehicle braking component and the wheel. Vehicle braking components such as brake rotors and brake drums are oftentimes made of cast iron, which can withstand the high friction forces and high temperatures generated during braking.

SUMMARY

A method of manufacturing a brake rotor or brake drum having a composite structure includes casting an aluminum alloy to form a core of the brake rotor or brake drum, the core defining a core surface, depositing a high entropy alloy or yttrium stabilized zirconia on the core surface to form a thermal barrier layer on the core surface, and depositing an iron-aluminum-silicon-zirconium alloy on the thermal barrier layer to form a wear-resistant layer on the thermal barrier layer, the wear-resistant layer defining a friction surface of the brake rotor or brake drum.

In other features, depositing the high entropy alloy or yttrium stabilized zirconia includes performing atom layer deposition to deposit the high entropy alloy or yttrium stabilized zirconia on the core surface.

In other features, the atom layer deposition includes a first half-cycle and a second half-cycle, the first half-cycle includes a precursor dosing stage and a purge stage, and the second half-cycle includes a co-reactant exposure stage and a purge stage.

In other features, the method includes repeating the first half-cycle and the second half-cycle until a thickness of the thermal barrier layer is greater than or equal to a specified threshold thickness.

In other features, the specified threshold thickness is within a range of 35 nanometers to 61 nanometers.

In other features, the specified threshold thickness within a range of 61 nanometers to 138 nanometers.

In other features, a deposition temperature is less than or equal to 250 degrees Celsius.

In other features, the precursor dosing stage includes applying a tetrakis-(dimethylamido) zirconium ($Zr(NMe_2)_4$) precursor for zirconia, applying a tris-(methylcyclopentadienyl) yttrium precursor for yttrium, and applying water as an oxidant for each precursor.

In other features, depositing the high entropy alloy or yttrium stabilized zirconia includes depositing the high entropy alloy to form the thermal barrier layer on the core surface.

In other features, depositing the high entropy alloy or yttrium stabilized zirconia includes depositing the yttrium stabilized zirconia to form the thermal barrier layer on the core surface.

In other features, depositing the yttrium stabilized zirconia includes depositing the yttrium stabilized zirconia in one or more super cycle, and each super cycle includes depositing seven cycles of zirconia and depositing one cycle of yttrium.

In other features, a growth rate of the thermal barrier layer is one nanometer per super cycle of deposition.

In other features, depositing the iron-aluminum-silicon-zirconium alloy includes depositing the iron-aluminum-silicon-zirconium alloy on the thermal barrier layer using a directed energy deposition process.

In other features, casting the aluminum alloy includes casting an aluminum-silicon alloy to form the core of the brake rotor or brake drum.

In other features, casting the aluminum alloy includes casting the aluminum alloy to form the core in a shape of a cylindrical body of a brake drum, the cylindrical body defining an inner surface and an outer surface, and depositing the high entropy alloy or yttrium stabilized zirconia includes depositing the high entropy alloy or yttrium stabilized zirconia on the inner surface of the cylindrical body.

In other features, casting the aluminum alloy includes casting the aluminum alloy to form the core in a shape of an annular disc of a brake rotor, the annular disc defining at least one annular surface, and depositing the high entropy alloy or yttrium stabilized zirconia includes depositing the high entropy alloy or yttrium stabilized zirconia on the at least one annular surface of the annular disc.

A method of manufacturing a composite structure for a vehicle braking component includes casting an aluminum alloy to form a vehicle braking component core, the vehicle braking component core defining a core surface, depositing a thermally insulating material directly on the core surface of the vehicle braking component core to form a thermal barrier layer, and depositing an iron-aluminum-silicon-zirconium alloy on the thermal barrier layer to form a wear-resistant layer on the thermal barrier layer, the wear-resistant layer defining a friction surface of the vehicle braking component.

In other features, depositing the thermally insulating material includes depositing the thermally insulating material using an atom layer deposition process.

A vehicle braking component having a composite structure includes a vehicle braking component core including an aluminum alloy, the vehicle braking component core defining a core surface, a thermally insulating material on the core surface of the vehicle braking component core, the thermally insulating material defining a thermal barrier layer, a thickness of the thermally insulating material being in a range between 50 and 100 nanometers, and the thermally insulating material including a high entropy alloy or yttrium stabilized zirconia deposited on the core surface at least partially by a process other than atomic layer deposition (ALD), and a wear-resistant layer on the thermal barrier layer, the wear-resistant layer comprising an iron-aluminum-silicon-zirconium alloy, and the wear-resistant layer defining a friction surface of the vehicle braking component.

In other features, the process other than atomic layer deposition is a physical vapor deposition process.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
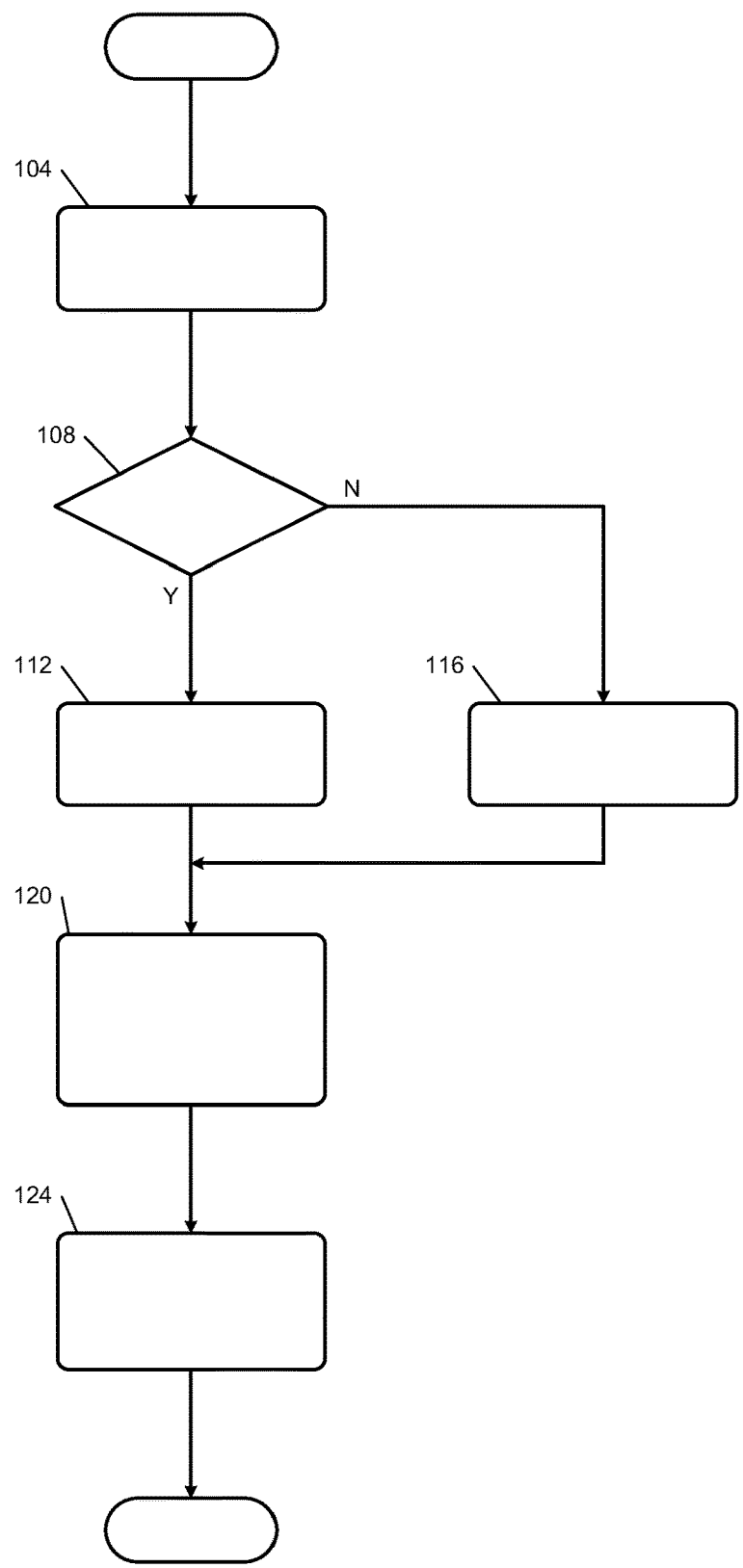
FIG. 1 is a flowchart depicting an example method of manufacturing a brake rotor or brake drum having a composite structure.

Some example embodiments described herein include a method of producing lightweight, multilayer and multifunctional Al—Si braking system components (e.g., rotors and drums) which are suitable for vehicles such as electric vehicles. Heat-resistant and wear-resistant multilayers may be coated on a lightweight Al—Si alloy surface, to enable the Al—Si alloy to perform comparably with cast iron but with an approximately ⅔ mass reduction compared to cast iron.

For example, a multilayer and multifunctional surface may enable an aluminum alloy such as Aluminum-Silicon (with or without anodization) to complete with cast iron as a braking material for vehicles (e.g., electric vehicles). In various implementations, a high temperature alloy such as Aluminum-Iron-Silicon-Zirconium (AlFeSiZr) may be used as an outer layer (e.g., a friction surface) to enhance the wear resistance of a composite brake component including an Al—Si alloy.

In some example embodiments, a low thermally conductive material such as Yttrium Stabilized Zirconia (YSZ), high entropy alloys (HEAs), etc. may be used as an interlayer (e.g., a thermal barrier), in order to allow an Al—Si core to withstand high temperatures at a friction surface of the braking component during extreme braking conditions of the vehicle. For example, a directed energy deposition process may be used to coat an AlFeSiZr outer layer of the braking component, and an atomic layer deposition process may be used to coat a YSZ or HEA interlayer of the braking component.

In various implementations, the wear-resistant layer (e.g., AlFeSiZr) may have a thermal conductivity in a range of 11-13 W/mK, and a melting temperature of approximately 1050 degrees Celsius. The heat-resistant layer (e.g., YSZ and/or HEAs) may have a thermal conductivity in a range of 0.4-1.5 W/mK, and a melting temperature of approximately 2700 degrees Celsius. The Al—Si alloy core may have a thermal conductivity in a range of 186-225 W/mK, and a melting temperature of approximately 580 degrees Celsius. The above values are for purposes of illustration, and other embodiments may have other parameter values.

In the example above, the thermal barrier layer (e.g., heat resistant layer of YSZ and/or HEAs, or other suitable materials) provides a thermal barrier between the Al—Si alloy core and the wear-resistant layer AlFeSiZr. The high melting point and low thermal conductively of the heat-resistant layer helps to inhibit or prevent high temperatures at the wear-resistant layer from conducting to the Al—Si alloy core (which has a much lower melting temperature).

In some example embodiments, a directed energy deposition (DED) process may be used to deposit a wear-resistance layer (such as an AlFeSiZr coating). An atomic layer deposition (ALD) process may be used to deposit a thermal barrier layer (such as YSZ or high entropy alloys).

For example, the ALD process may include a first half cycle that includes precursor dosing and purging, and a second half cycle that includes co-reactant exposure and purging. The cycles may be repeated as desired until a thickness of the thermal barrier layer reaches a specified thickness threshold (e.g., a desired thickness of the thermal barrier layer to provide sufficient thermal protection between the wear-resistant layer and the brake component core).

In an example embodiment, an ALD process may be used to form an yttrium stabilized zirconia (YSZ) layer using precursors of tetrakis-(dimethylamido) zirconium (Zr(NMe$_2$)$_4$) for zirconia, tris-(methylcyclopentadienyl) yttrium for yttria. Water may be used as the oxidant for both precursors.

Using an ALD process for depositing the thermal barrier layer may allow for lower temperatures to be applied to the aluminum alloy of the brake component core. For example, a deposition temperature of about 250 degrees Celsius (or higher or lower temperatures) may be used when the thermal barrier layer material is deposited on the aluminum alloy of the brake component core. This may provide better protection to the aluminum alloy during manufacturing of the composite brake component, as compared to, for example, a higher temperature that would be applied to the aluminum alloy if the thermal barrier material was applied to the aluminum core using a directed energy deposition process.

In some example embodiments, an ALD process may include multiple super cycles of depositing different thermal materials to form the thermal barrier layer at a desired thickness. For example, 7 zirconia deposition cycles and 1 yttria deposition cycle may be combined in one super cycle. Each super cycle may produce a specified thickness, such as about one nanometer of growth per super cycle.

The super cycles may be repeated until the thickness of the thermal barrier layer reaches a desired value. Example thicknesses may include, but are not limited to, about 35 nm, about 61 nm, about 138 nm, etc. In various implementations, the thickness of the thermal barrier layer may be in a range inside of our outside of those example values, may have other suitable thickness values, etc.

Example benefits of using an ALD process to form the thermal barrier layer may include, but are not limited to, a low temperature chemical vapor deposition, overcoming significant melting temperature differences between an Al—Si alloy substrate (e.g., braking component core) and a YSA or HEA coating layer for the thermal barrier layer, and providing high quality conformal coating on a complex subject (e.g., a brake drum core) with precise thickness control.

In some example embodiments, the ALD process may be suited for a range of 50-100 nanometers in thickness. In this thickness range, the temperature of the Al—Si core may be higher than a temperature threshold of the Al—Si alloy during hard braking events (e.g., because the thermal barrier layer may not be thick enough to inhibit heat transfer from the wear-resistant layer to the Al—Si alloy core). The ALD process may be used for braking components that will be used in electric vehicles (which typically have lower braking component temperatures than internal combustion engine vehicles), although the ALD process may be used for braking components of any type of vehicle.

FIG. 1 depicts an example process for manufacturing a brake rotor or brake drum having a composite structure. At 104, the process includes identifying a type of vehicle braking component to be manufactured, such as a brake rotor or brake drum. Although FIG. 1 refers to brake rotors or drums, other embodiments may include any suitable type of vehicle braking component.

At 108, the process includes determining whether a brake drum will be manufactured. If so, the process proceeds to 112 to cast the brake drum core using an aluminum alloy. For example, an aluminum-silicon alloy may be cast into a cylindrical body of a brake drum core.

If the process determines at 108 that a brake drum is not being manufactured, the process proceeds to 116 to cast a brake rotor core using an aluminum alloy. For example, an aluminum-silicon alloy may be cast into a disc shape of a brake rotor core.

Although FIG. 1 illustrates identification and determination of brake component type at 104 and 108, this is for purposes of illustration. In other some example embodiments, manufacturing equipment may be designed for a specific braking component, such that it is not necessary to determine which type of component will be manufactured.

After casting the brake drum core or the brake rotor core using the aluminum alloy, a thermal barrier layer is deposited on the drum core or the brake core using atomic layer deposition at 120. An example process for atomic layer deposition is described further below with reference to FIG. 2.

At 124, the process includes depositing a wear-resistant layer (such as AlFeSiZr) on the thermal barrier layer. The wear-resistant layer may be deposited on the thermal barrier layer using a directed energy deposition process, as described further below with reference to FIG. 4.

Figure 2:
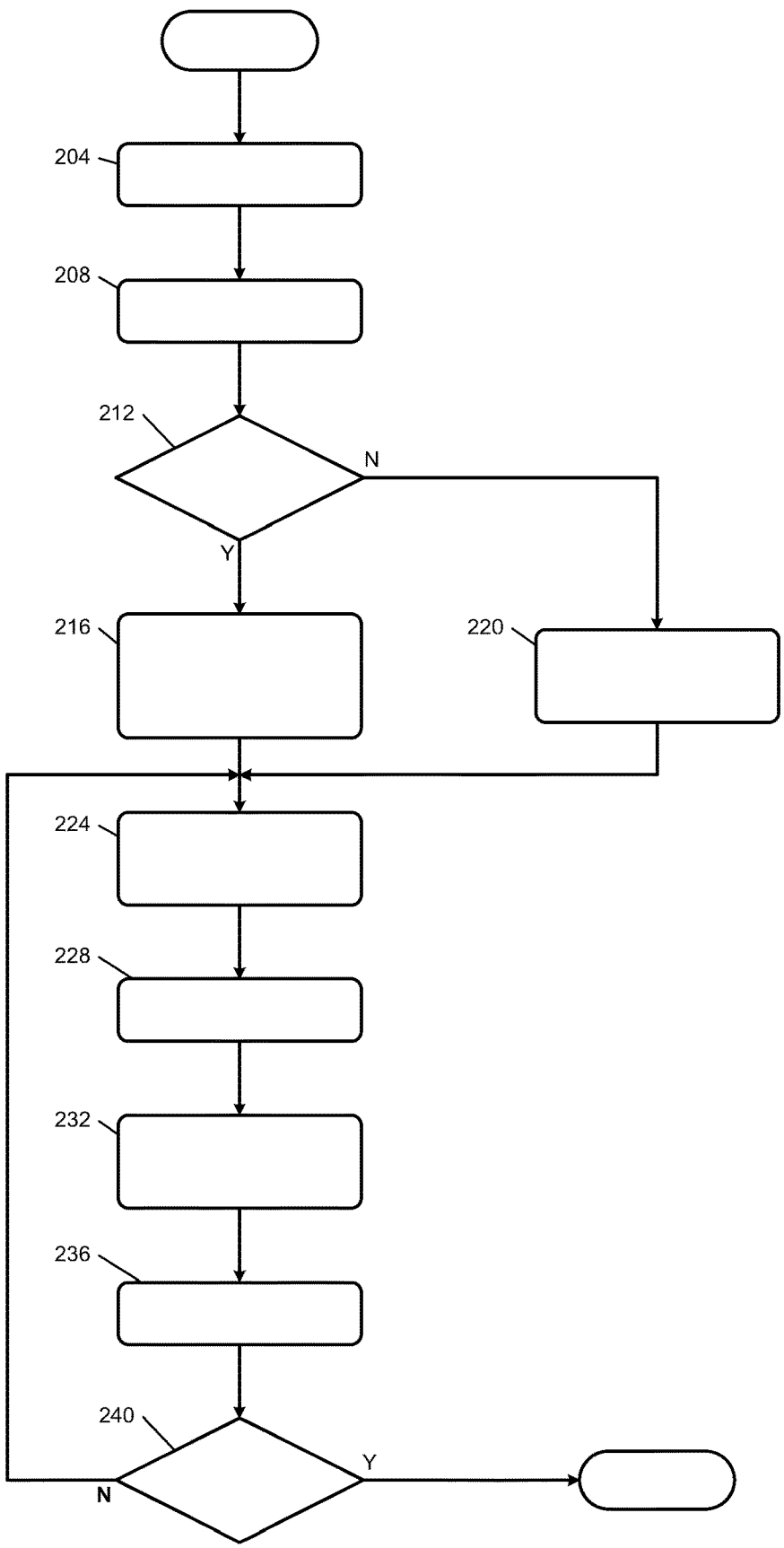
FIG. 2 is a flowchart depicting an example process for manufacturing a thermal barrier layer of a brake rotor or brake drum having a composite structure.

FIG. 2 illustrates an example process for performing atomic layer deposition (ALD). The ALD process may be used to produce, e.g., a thermal barrier layer on an aluminum alloy core of a vehicle braking component. In various implementations, ALD may be considered as a thin-film deposition technique based on the sequential use of a gas-phase chemical process, and may be a subclass of chemical vapor deposition.

Some ALD reactions may use two chemicals called precursors (also called "reactants"), which may react with the surface of a material one at a time in a sequential, self-limiting, manner. A thin film is slowly deposited through repeated exposure to separate precursors.

At 204, the process beings by determining a thermal material type for the thermal barrier layer. Example thermal materials may include, but are not limited to, yttrium stabilized zirconia (YSZ), high entropy alloys (HEAs), etc.

At 208, the process identifies a specified thickness layer threshold. For example, a thermal barrier layer may have a desired thickness of 10 nm, 50 nm, 100 nm, etc., which may be selected based on a desired amount of thermal insulation between a friction surface of wear-resistant layer, and an aluminum alloy core of the composite brake component.

The process determines at 212 whether a YSZ material is selected. If so, the process begins the atomic layer deposition process at 216, using materials for yttrium stabilized zirconia. If the process determines at 212 that a YSZ material is not selected, the process proceeds to 220 to begin the atomic layer deposition process for a high entropy alloy. Although FIG. 2 illustrates determining a material type at 212, it should be appreciated that in some example embodiments, manufacturing equipment may be designed for a specific thermal barrier layer material, such that determination of a material at 212 is not necessary.

At 224, the process includes applying a precursor material to the core component. In the example of YSZ, a precursor of tetrakis-(dimethylamido) zirconium ($Zr(NMe_2)_4$) may be used for zirconia, and a precursor of tris-(methylcyclopentadienyl) yttrium may be used for yttria. Water may be used as the oxidant for both precursors.

At 228, the process includes purging the reaction products. The process then exposes co-reactant material to the thermal barrier layer at 232, and purges the reaction products at 236. At 240, the process includes determining whether the thickness of the thermal barrier layer has reached a specified layer thickness threshold value.

For example, the steps of applying the precursor material at 224, purging the reaction products at 228, exposing co-reactant material to the thermal barrier layer at 232, and purging the reaction products at 236, may be repeated in multiple cycles where a specified growth thickness is added to the thermal barrier layer in each cycle. If the thickness of the thermal barrier layer is greater than the specified threshold value at 240, the process is complete. If the thickness is less than the threshold value, the process returns to 224 to perform another cycle of depositing precursor materials and exposing co-reactant material to the thermal barrier layer.

Figure 3A:
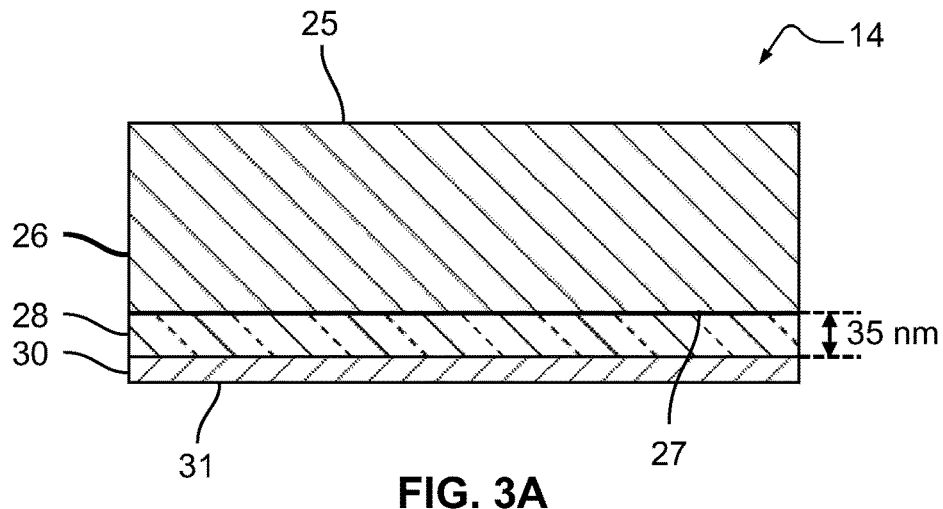
FIGS. 3A, 3B and 3C are cross-sectional views of a brake drum having a composite structure, illustrating three different thicknesses of the thermal barrier layer.
Figure 3B:
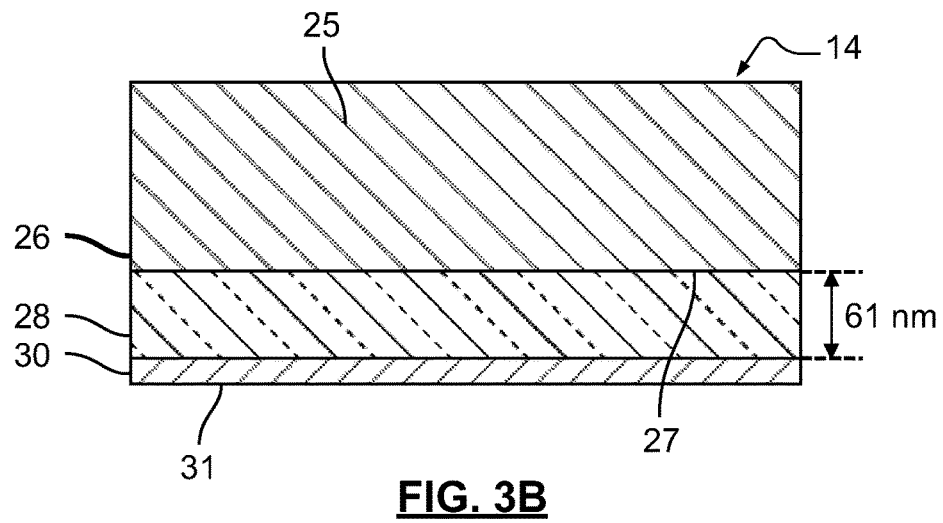
Figure 3C:
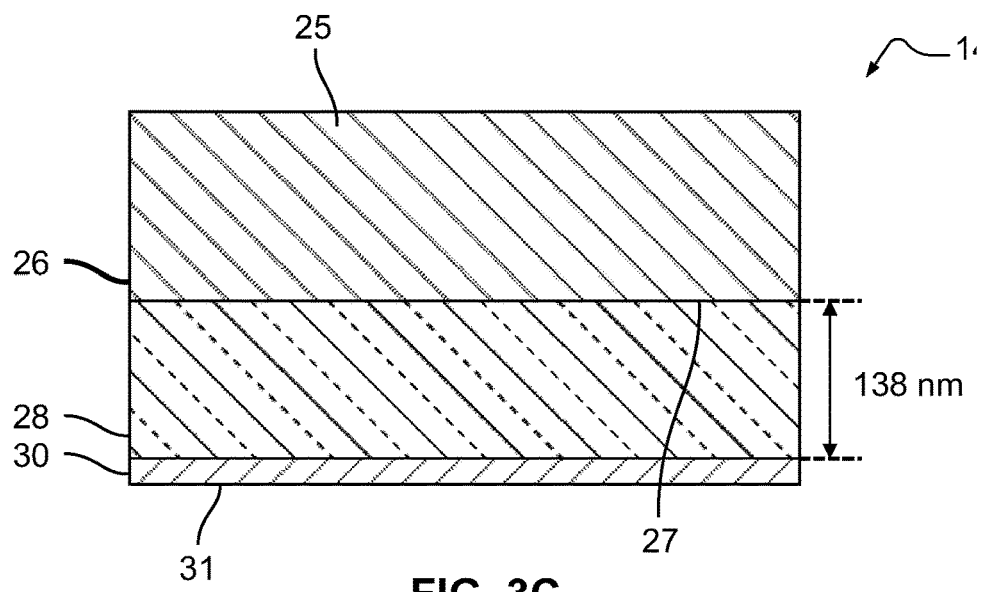

FIGS. 3A, 3B and 3C are cross-sectional views of a brake drum having a composite structure, illustrating three different thicknesses of the thermal barrier layer formed by various cycles of an ALD process. For example, in FIG. 3A, a thermal barrier layer 28 of a cylindrical body 14 of a bake drum is formed between a core 26 and a wear-resistant layer 30.

The core 26 includes an outer surface 25 and an inner surface 27. The wear-resistant layer 30 includes a friction surface 31 for engaging a brake pad during breaking of a vehicle. As shown in FIG. 3A, the thermal barrier layer 28 has a thickness of about 35 nm.

FIG. 3B is similar to FIG. 3A, but the thermal barrier layer 28 in FIG. 3B has a thickness of about 61 nm. FIG. 3C is also similar to FIGS. 3A and 3B, but the thermal barrier layer 28 in FIG. 3C has a thickness of about 138 nm. The example thicknesses in FIGS. 3A-3C may be varied depending on a number of cycles of deposition of the ALD process. Although FIGS. 3A-3C illustrate various example thicknesses, other example embodiments may include thermal barrier layers 28 having other suitable thickness values.

Although FIGS. 3A-3B illustrate creating a thermal barrier layer using an ALD process, in other embodiments other suitable coating techniques may be used to form the thermal barrier layer 28. For example, a physical vapor deposition (PVD) coating process may be used to form the thermal barrier layer 28, such as by forming a thermal barrier layer of YSZ or HEAs using a physical vapor deposition coating process. In various implementations, a braking rotor or drum may have a thin (e.g., 50 to 100 nm) coating of YSZ or HEAs using a coating technique other than ALD, such as PVD, etc.

Figure 4:
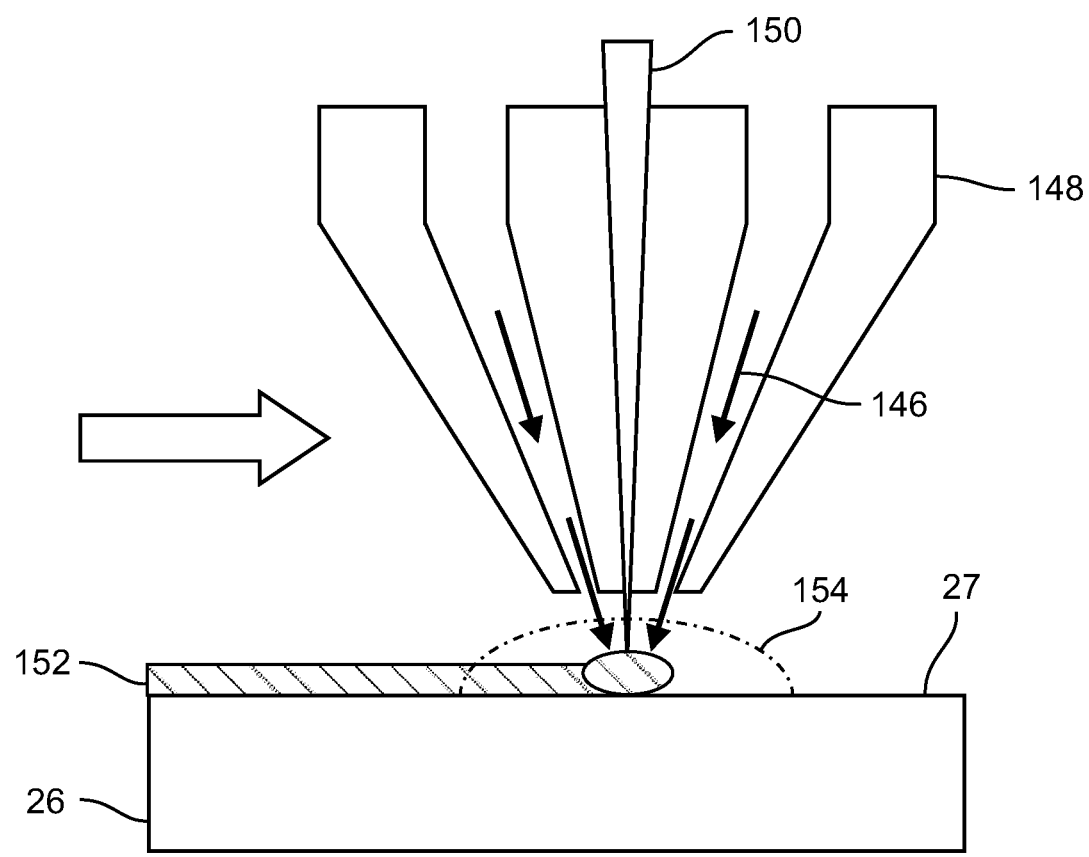
FIG. 4 is a cross-sectional view of an apparatus for depositing a thermal barrier layer and a wear-resistant layer on a core of a brake drum or brake rotor.

Referring again to FIG. 1, at 124, the process includes depositing a wear-resistant layer (such as AlFeSiZr) using directed energy deposition. FIG. 4 illustrates an example apparatus for depositing the Fe—Al—Si—Zr alloy of the wear-resistant layer 30 on the thermal barrier layer 28, using a directed energy deposition (DED) processes.

During the directed energy deposition processes, a feedstock material 146 is deposited by a nozzle 148 on the inner surface 27 of the core 26, and simultaneously melted by application of a focused energy source 150 thereto. The nozzle 148 and focused energy source 150 are advanced along the inner surface 27 of the core 26 in a predefined pattern, leaving behind a layer of solidified feedstock material. The focused energy source may be a plasma arc, electron beam, or laser. A shielding gas may be applied to a zone 154 surrounding the deposition site to prevent or inhibit undesired side reactions.

The feedstock material 152 may be in the form of a wire or a powder and may exhibit substantially the same composition as the layer being formed. For example, during formation of the thermal barrier layer 28, the feedstock material 152 may have substantially the same composition as that of the thermally insulating material. Likewise, during formation of the wear-resistant layer 30, the feedstock material 152 may have substantially the same composition as that of the Fe—Al—Si—Zr alloy. In another example embodiment, the feedstock material is an iron-based wire.

In some example embodiments described herein, a composite brake drum for vehicles includes both an aluminum-silicon (Al—Si) alloy and an aluminum-iron-silicon-zirconium (AlFeSiZr) alloy, with a thermal barrier between two layers. Aluminum alloys such as Al—Si may be, for example, ⅓ of the weight of cast iron. However, aluminum alloys such as Al—Si may be limited in use as a whole brake drum, due to Al—Si having a lower temperature limit than, e.g., cast iron. For example, an Al—Si alloy may have a safe temperature limit of less than 350° C.

Some aluminum alloys have better heat resistance than Al—Si, such as an AlFeSiZr alloy. However, due to its brittleness, an AlFeSiZr alloy may not perform as desired for a drum core material. An AlFeSiZr alloy may be better suited as a cladding material that provides better wear resistance and corrosion resistance (e.g., compared to cast iron). For example, structural integrity of an AlFeSiZr alloy may remain intact up to, e.g., 900° C. An AlFeSiZr alloy may be very suitable for the friction surface of the drum brake, where friction material rubs against brake pads or brake shoes to stop a vehicle during braking.

In view of the above, a high-temperature-tolerant, lightweight brake drum may include an aluminum alloy like AlFeSiZr alloy on the friction surface, and a lightweight material like Al—Si alloy as a core material. However, due to high conductivity of Al—Si compared to cast iron (e.g., 200 W/mK vs. 50 W/mK), a brake drum core temperature may reach higher than the temperature of cast iron as shown below (for example, due to heat conduction from the friction surface of the AlFeSiZr alloy to the core material Al—Si alloy).

In various implementations, example drum brake assemblies may include a thermal barrier (such as a high entropy alloy (HEA)) between a lightweight Al—Si alloy in the drum core, and a wear-resistant, high-heat-tolerant, and corrosion-resistant AlFeSiZr alloy on the surface, in order to retain advantages of both materials without sacrificing performance. For example, with a thermal barrier like a HEA, it may be possible to maintain the drum core temperature at a lower level, compared to an implementation without a thermal barrier layer. In various implementations, the thicknesses of each layer may be adjusted as desired, to optimize the thermal performance, material wear, structural strength, etc.

In some example embodiments, a composite brake drum may include Al—Si as a drum core material. Al—Si is ductile and easily cast-able for complex shapes such as cylindrical brake drums.

A thermal barrier including one or more high entropy alloys may be laid over a surface of the drum core material (such as the inner surface of a cylindrical drum core). In various implementations, no bonding material is applied between the drum core and the thermal barrier layer. This thermal barrier layer may include small perforations, so that the friction layer material flows into the drum core material through the perforations, allowing the friction layer material to bond or fuse with the drum material.

The friction layer of composite brake drum, which may contact or engage friction material of brake pads or brake shoes, may be made out of a heat, wear and corrosion resistant Al alloy such as AlFeSiZr. This friction layer may provide superior heat, wear and corrosion resistance compared to, for example, cast iron.

In various implementations, a composite brake drum ay be manufactures by converting the surface of a cast Al—Si brake drum using directed energy deposition (DED) of, for example, Fe-based wire or powders, in order to create a wear-resistant AlFeSiZr intermetallic layered surface suitable for brake friction surfaces. The AlFeSiZr intermetallic layered surface may be bonded to the Al-alloy drum core, through perforations on the thermal barrier layer. A strong bond may be created due to the alloying elements Al and Si coming directly from the substrate during the DED process.

In some example embodiments, applying separate wear-resistant and heat-resistance coatings, with a thermal barrier layer, may allow for production of a composite brake drum that beats performance of, e.g., cast iron, while providing a lighter weight and superior wear resistance and corrosion resistance compared to a cast iron brake drum. Example composite brake drums including lightweight aluminum alloys for wear-resistant and heat-resistant layers, may be cost-effective since all three materials may be very affordable even compared to a cast iron brake drum. In various implementations, each layer of the composite brake drum may be added on top of substrate in a cylindrical shape, by boding or fusing each layer together and maintaining the integrity of the composite brake drum.

It may be desirable to manufacture brake drums of automotive vehicles from relatively lightweight aluminum, instead of cast iron, to decrease the weight of the vehicles. It may be desirable to develop an aluminum alloy drum brake for an automotive vehicle that exhibits wear-resistance and thermal stability at least as high as that of cast iron.

In some example embodiments, a brake drum exhibits a composite structure that allows the brake drum to be relatively light weight (e.g., as compared to brake drums primarily made of cast iron), while also exhibiting exceptional wear resistance and thermal stability. The brake drum may have a cylindrical body with at least one friction surface (e.g., on an inner surface of the cylindrical body).

The cylindrical body may include a drum core made of a relatively light weight Al—Si alloy, and a wear-resistant layer on the inner friction surface of the cylindrical body. The wear-resistant layer is made of an Fe—Al—Si—Zr alloy that is relatively hard and dense, as compared to the Al—Si alloy of the drum core.

A thermal barrier layer is sandwiched between the wear-resistant layer and the Al—Si alloy of the drum core. The thermal barrier layer may thermally insulate the Al—Si alloy of the drum core from the relatively high temperatures generated in the wear-resistant layer during braking. For example, the thermal barrier layer disposed on an inner surface of the Al—Si alloy of the drum core may help maintain the drum core at a temperature of less than about 350 degrees Celsius (° C.), even in situations where the temperature of the wear-resistant layer is greater than about 550° C.

Figure 5:
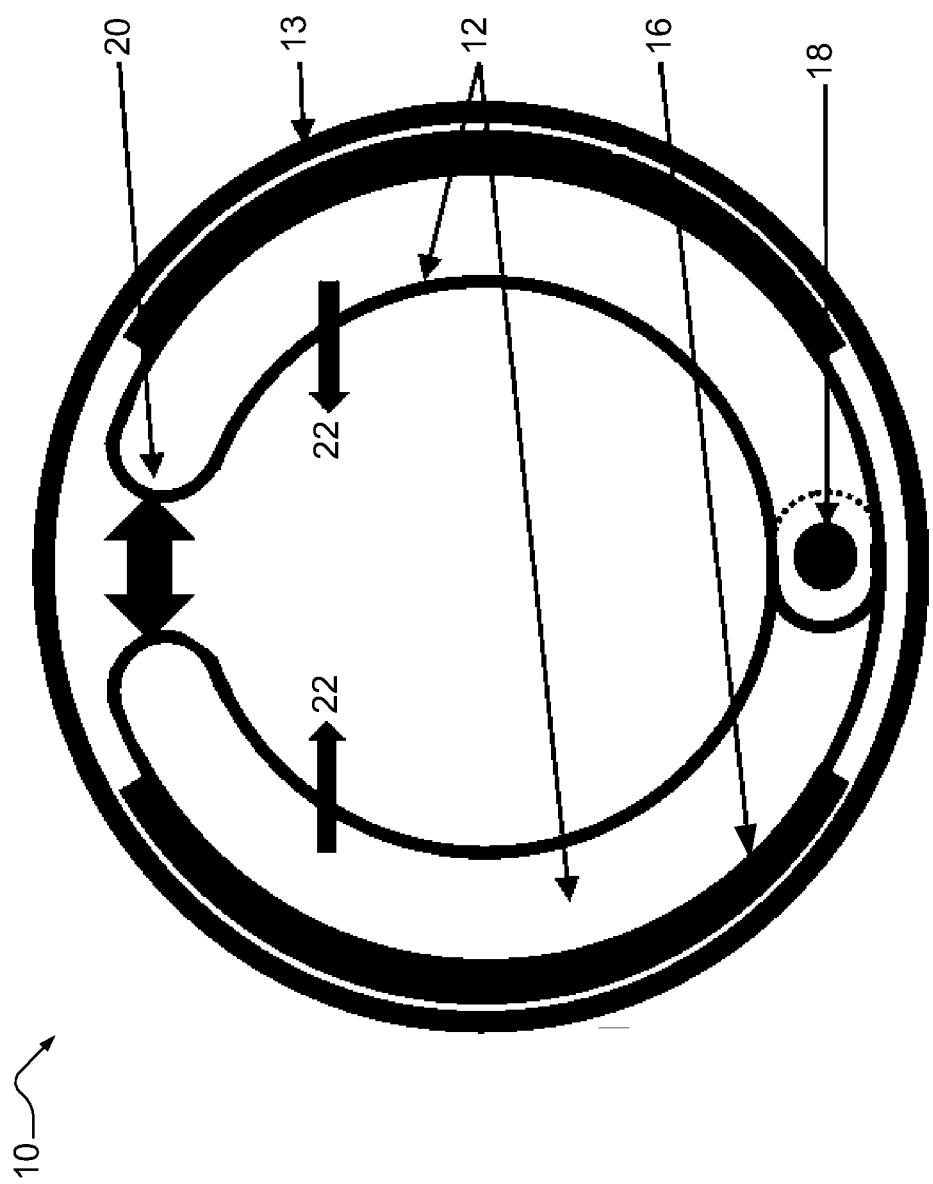
FIG. 5 is a front view of a drum brake assembly of a motor vehicle, including a composite brake drum.

FIG. 5 depicts a brake drum assembly 10 for a motor vehicle (not shown). The brake drum assembly 10 includes a cylindrical body 13. The cylindrical body 13 may be configured to mount, couple, connect, etc., to a rotatable axle of the motor vehicle (such as via a hub, etc.). For example, the cylindrical body 13 may be configured to engage with friction surfaces of brake pads 12 (or brake shoes, etc.), in order to generate frictional forces that oppose rotation of the cylindrical body 13 during braking.

Each brake pad 12 may include, for example, two pieces of steel welded together. Friction material 16 may be riveted to a lining table, attached with adhesive, etc. The brake pad 12 may have a crescent-shaped piece, which contains holes and slots in different shapes for return springs 22, hold-down hardware, parking brake linkage, self-adjusting components, etc.

Application force of the wheel cylinder may be applied through the crescent-shaped piece (e.g., web) to the lining table and brake lining. The edge of the lining table may have three "V"-shaped notches or tabs on each side (sometimes referred to as nibs). The nibs rest against the support pads of the backing plate to which the brake pads 12 are installed.

The drum brake assembly has two brake pads 12, which may include a primary and a secondary. The primary brake pad 12 may be located toward the front of the vehicle and have the lining positioned differently from the secondary brake pad 12. The brake pads 12 may move opposite one another at a pivot 18.

A wheel cylinder 20 may operate the brake on each wheel. For example, two pistons may operate the brake pads 12, with one at each end of the wheel cylinder 20. The leading brake pad 12 (closest to the front of the vehicle) may be referred to as the primary shoe. The trailing brake pad 12 may be referred to as the secondary shoe. Hydraulic pressure from the wheel cylinder 20 may act on a piston cup, pushing the pistons toward the brake pads 12, forcing them against the cylindrical body 13 of the drum. When the driver releases the brakes, the return springs 22 restore the brake pads 12 to their original (disengaged) position.

The brake drum assembly 10 may exhibit other configurations, as will be appreciated by persons of ordinary skill in the art. For example, in some aspects, the cylindrical body 13 may include an outer friction surface configured to engage a brake pad or brake shoe positioned outside of the cylindrical body 13, the cylindrical body 13 may be coupled to a rotatable axle of a motor vehicle by other means, etc.

Figure 6:
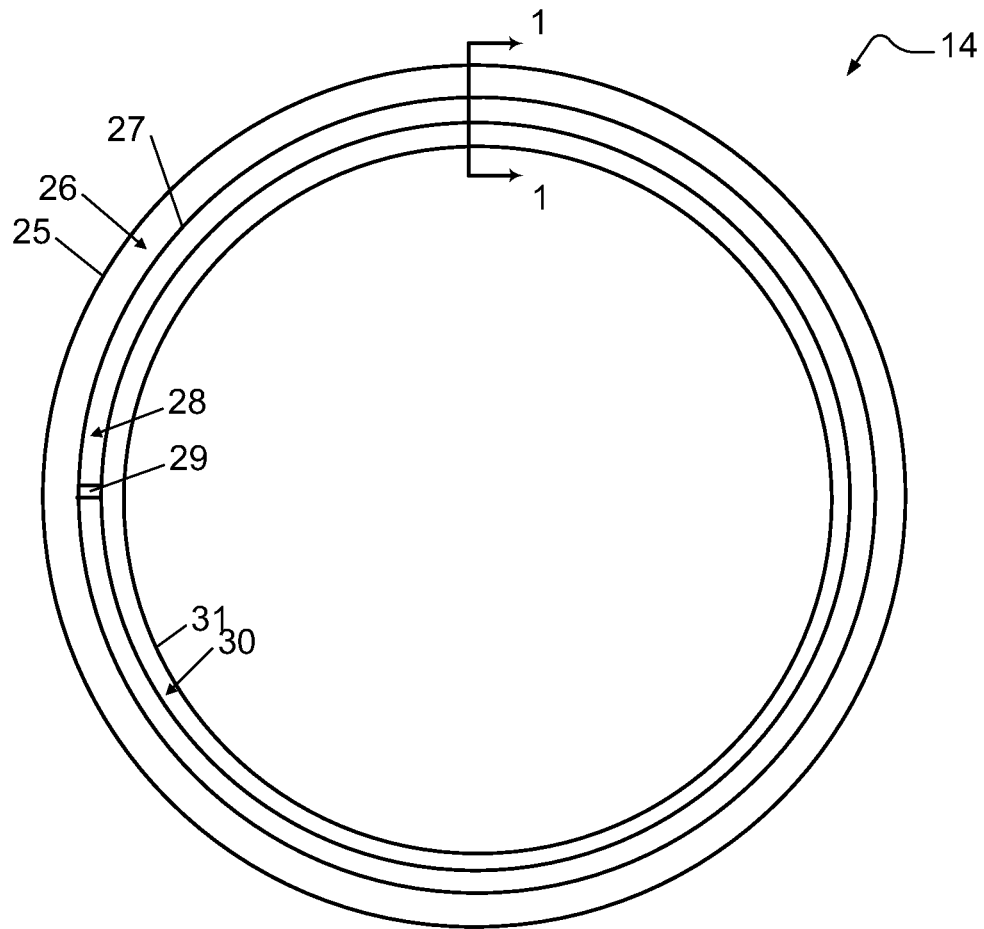
FIG. 6 is a front view of the composite brake drum of FIG. 5, illustrating layers of the composite brake drum.
Figure 7:
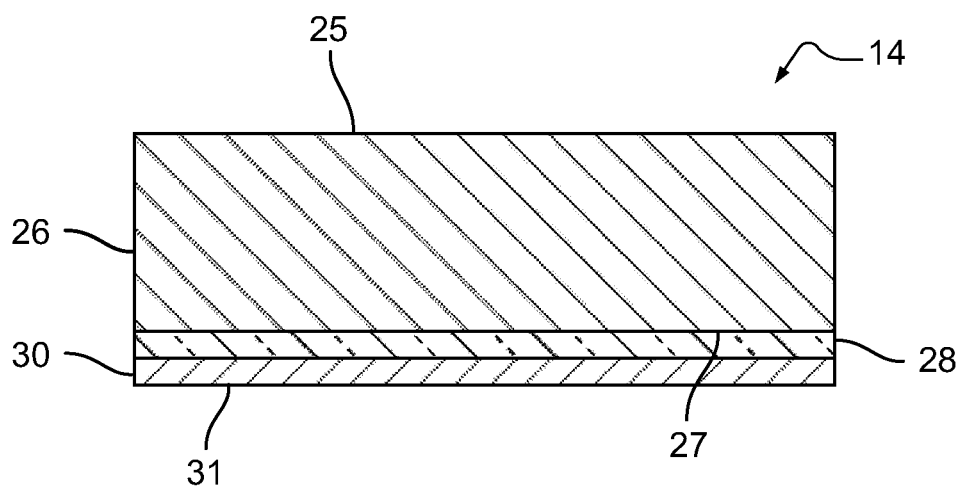
FIG. 7 is a cross-sectional view of the composite brake drum of FIG. 6, taken along line 1-1 of FIG. 6.

Referring now to FIGS. 6 and 7, the cylindrical body 13 exhibits a composite structure comprising a core 26, a thermal barrier layer 28, and a wear-resistant layer 30. The core 26 includes at least one cylindrical substrate that defines an outer surface 25 and an inner surface 27. The core 26 may have any suitable thickness, measured between the outer surface 25 and the inner surface 27, such as greater than or equal to about 9 millimeters to less than or equal to about 36 millimeters. The core 26 may be of unitary one-piece construction.

The core 26 may include a hypereutectic aluminum alloy comprising, in addition to aluminum, at least one alloying element including silicon (Si), and thus may be referred to as an Al—Si alloy. The amount of silicon in the Al—Si alloy is selected to provide the Al—Si alloy with good castability, fluidity, and wear-resistance. The Al—Si alloy may comprise, by mass, greater than or equal to about 80% to less than or equal to about 87% aluminum and greater than or equal to about 13% to less than or equal to about 20% silicon.

In some example embodiments, the aluminum alloy may comprise, by mass, about 88.9% to about 91% aluminum, and about 8.5% to about 9.5% silicon. The aluminum alloy may be a 359.0 aluminum allow using the Aluminum Association (AA) designation, or A03590 using a UNS number. In various implementations, the aluminum alloy may comprise, by mass, about 7% to about 20% silicon, about 0.4% to about 0.9% magnesium, and about 79.1% to about 92.6% aluminum.

In some aspects, the Al—Si alloy may comprise carbon (C) as an alloying element. For example, the Al—Si alloy may comprise, by mass, greater than or equal to about 4% to less than or equal to about 8% carbon. The carbon may be present in the Al—Si alloy in the form of silicon carbide (SIC). For example, the Al—Si alloy may comprise, by mass, greater than or equal to about 10% to less than or equal to about 20% silicon carbide.

As compared to cast iron, the Al—Si alloy may exhibit excellent corrosion resistance, high ductility, and low density. For example, the Al—Si alloy may have a density of greater than or equal to about 2,600 kilograms per cubic meter ($kg/m^3$) to less than or equal to about 2,800 $kg/m^3$. For example, the Al—Si alloy may have a density of about 2,700 $kg/m^3$.

The Al—Si alloy may exhibit a thermal conductivity of greater than or equal to about 186 watts per meter-kelvin (W/m·K) to less than or equal to about 225 W/m·K, and a specific heat of greater than or equal to about 0.9 kJ/kg·K to less than or equal to about 1.3 kJ/kg·K.

The thermal barrier layer 28 is disposed on the inner surface 27 of the core 26, and is configured to inhibit heat transfer from the friction surface of the cylindrical body 13 to the core 26 during braking. In some aspects, the thermal barrier layer 28 may be deposited directly on the inner surface 27 of the core 26.

The thermal barrier layer 28 may help maintain the core 26 at a temperature of less than about 350° C., even in situations where the temperature of the wear-resistant layer 30 is greater than about 550° C. The thermal barrier layer 28 may have any suitable thickness, measured from the inner surface 27 of the core 26, such as greater than or equal to about 0.1 millimeters to less than or equal to about 4 millimeters. An example thickness may include less than or equal to about 2 millimeters. The thermal barrier layer 28 may be substantially coextensive with the inner surface 27 of the core 26.

The thermal barrier layer 28 may be made of a thermally insulating material having a relatively low thermal conductivity, as compared to the thermal conductivity of the core 26 and the wear-resistant layer 30. For example, the thermal conductivity of the thermally insulating material may be about 5-20% of that of the wear-resistant layer 30. The thermal conductivity of the thermally insulating material may be greater than or equal to about 0.4 W/m·K to less than or equal to about 0.7 W/m·K, in a range of about 0.5 W/m·K to less than or equal to 2 W/m·K, etc.

The thermally insulating material may have a density in a range of about 1,300 kg/m$^3$ to about 1,500 kg/m$^3$, such as about 1,460 kg/m$^3$. The thermally insulating material may have a specific heat in a range of about 135 kJ/kg·K to about 1.7 kJ/kg·K, such as about 1.5 kJ/kg·K.

The thermally insulating material of the thermal barrier layer 28 may comprise a high entropy alloy, a high entropy ceramic, a combination thereof, etc. A high entropy alloy or ceramic material is an inorganic alloy or ceramic material that may comprise at least four elements, with each element being present in the alloy or ceramic at a concentration, on an atomic basis, of greater than or equal to about 5% to less than or equal to about 35%. The inorganic alloy or ceramic material may exist in the form of a solid solution with no intermetallic phases.

Examples of high entropy alloys include bismuth and tellurium (Bi—Te)-based materials and bismuth, antimony, tellurium, and selenium (Bi—Sb—Te—Se)-based materials, e.g., BiSbTe$_{1.5}$Se$_{1.5}$ and/or (BiSbTe$_{1.5}$Se$_{1.5}$)$_{1-x}$Ag$_x$, where x is about 0.9 atomic percent.

Examples of high entropy ceramics include zirconate (Zr$_x$O$_y^{-z}$)-based materials and rare earth metal zirconate (Re$_2$Zr$_2$O$_7$)-based materials, where Re is La$_2$O$_3$, Nd$_2$O$_3$, Sm$_2$O$_3$, Eu$_2$O$_3$, Gd$_2$O$_3$, and/or Y$_2$O$_3$. In some example embodiments, Re$_2$O$_3$ includes five constituents with equal atomic percentage: (20% La$_2$O$_3$, 20% 2Nd$_2$O$_3$, 20% 2Sm$_2$O$_3$, 20% Gd$_2$O$_3$, and 20% Y$_2$O$_3$)-2ZrO$_2$.

The wear-resistant layer 30 is disposed on the thermal barrier layer 28 and defines the inner friction surface of the cylindrical body 13 of the brake drum assembly 10. In some aspects, the wear-resistant layer 30 may be directly deposited on the thermal barrier layer 28.

The wear-resistant layer 30 is configured to provide the inner friction surface of the cylindrical body 13 with high wear-resistance and excellent thermal stability. For example, the wear-resistant layer 30 may be formulated to exhibit exceptional mechanical stability at high temperatures, e.g., at temperatures of up to about 1,300° C.

The wear-resistant layer 30 may have any suitable thickness, measured from the surface of the thermal barrier layer 28, such as greater than or equal to about 1 millimeter to less than or equal to about 4 millimeters (e.g., less than or equal to about 3 millimeters). The wear-resistant layer 30 may be substantially coextensive with the thermal barrier layer 28 and the inner surface 27 of the core 26.

The wear-resistant layer 30 may be made of an iron alloy comprising, in addition to iron (Fe), alloying elements of aluminum (Al), silicon (Si), and zirconium (Zr), and thus may be referred to as an Fe—Al—Si—Zr alloy. The amount of aluminum, silicon, and zirconium in the iron alloy are selected to provide the Fe—Al—Si—Zr alloy with high strength, exceptional wear resistance, oxidation resistance, and corrosion resistance.

The Fe—Al—Si—Zr alloy may comprise, by mass, greater than or equal to about 45% to less than or equal to about 60% iron, greater than or equal to about 35% to less than or equal to about 45% aluminum, greater than or equal to about 1% to less than or equal to about 3% zirconium, and greater than or equal to about 0.5% to less than or equal to about 2% silicon. In an example embodiment, the Fe—Al—Si—Zr alloy may comprise, by mass, about 59% iron, about 36% aluminum, about 3% zirconium, and about 1% silicon. In the Fe—Al—Si—Zr alloy, the iron, aluminum, silicon, and zirconium may be present in the form of FeAlSiZr-containing intermetallic particles.

In some aspects, the Fe—Al—Si—Zr alloy may comprise a grain refiner. Examples of grain refiners include boride compounds, e.g., chromium(III) boride (CrB), tantalum boride (TaB and/or TaB$_2$), etc. In aspects where the grain refiner comprises chromium(III) boride and tantalum boride, the mass ratio of chromium(III) boride to tantalum boride in the Al—Fe—Si—Zr alloy may be about 1:1. The grain refiner may be present in the Fe—Al—Si—Zr alloy in an amount, by mass, greater than or equal to about 0.05% to less than or equal to about 1% of the Fe—Al—Si—Zr alloy.

The Fe—Al—Si—Zr alloy may exhibit a relatively high density, as compared to the density of the Al—Si alloy and/or the thermally insulating material. For example, the Fe—Al—Si—Zr alloy has a density of greater than or equal to about 4,800 kg/m$^3$ to less than or equal to about 5,200 kg/m$^3$. In one example, the Fe—Al—Si—Zr alloy may have a density of about 4,990 kg/m$^3$. The Fe—Al—Si—Zr alloy may have a thermal conductivity of greater than or equal to about 11 W/m·K to less than or equal to about 13 W/m·K, and a specific heat of greater than or equal to about 0.61 kJ/kg·K to less than or equal to about 0.67 kJ/kg·K.

Additional elements not intentionally introduced into the composition of the presently disclosed Al—Si alloy and/or the Fe—Al—Si—Zr alloy nonetheless may be inherently present in the alloys in relatively small amounts, for example, in individual and/or cumulative amounts, by mass, less than or equal to about 1%, less than or equal to about 0.1%, less than or equal to about 0.05%, less than or equal to about 0.01% of the alloys, etc. Such elements may be present, for example, as impurities in the raw or scrap materials used to prepare the alloys. In example embodiments where the alloys are referred to as comprising one or more alloying elements (e.g., Si) and aluminum or iron as balance, the term "as balance" does not exclude the presence of additional elements not intentionally introduced into the composition of the alloys but nonetheless inherently present in the alloys in relatively small amounts, e.g., as impurities.

In some example embodiments, a brake rotor may include a composite structure that allows the brake rotor to be relatively light weight (as compared to brake rotors primarily made of cast iron), while also exhibiting exceptional wear resistance and thermal stability. The brake rotor has an annular body with first and second friction surfaces disposed on opposite sides thereof. The annular body comprises a core made of a relatively light weight Al—Si alloy and first and second wear-resistant layers respectively disposed on the first and second friction surfaces of the annular body. The first and second wear-resistant layers are made of an Fe—Al—Si—Zr alloy that is relatively hard and dense, as compared to the Al—Si alloy of the core. First and second thermal barrier layers are respectively sandwiched between the first friction surface and the first wear-resistant layer and between the second friction surface and the second wear-resistant layer. The first and second thermal barrier layers thermally insulate the Al—Si alloy of the core from the relatively high temperatures generated in the first and second wear-resistant layers during braking. For example, the first and second thermal barrier layers disposed on opposite sides of the Al—Si alloy of the core may help maintain the core at a temperature of less than about 350 degrees Celsius (° C.), even in situations where the temperature of the first and second wear-resistant layers is greater than about 550° C.

Figure 8:
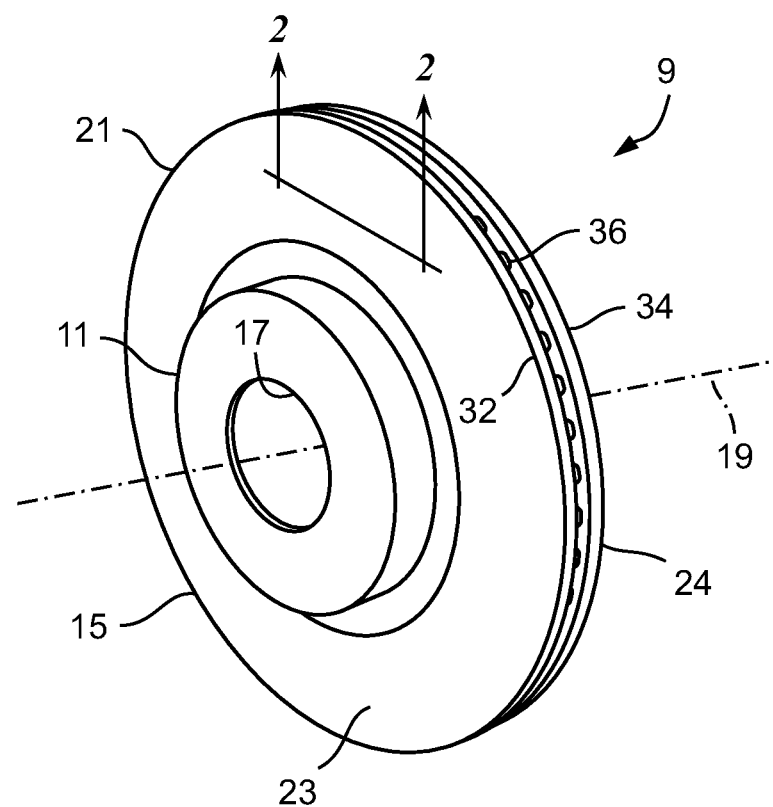
FIG. 8 is an orthogonal view of a brake rotor for a disc brake assembly of a motor vehicle, wherein the brake rotor includes a hub and an annular body.

FIG. 8 depicts a brake rotor 9 for a disc brake assembly of a motor vehicle (not shown). The brake rotor 9 includes a hub 11, an annular body 15, and a central opening 17 that defines an axis of rotation 19 of the brake rotor 9. The hub 11 may be configured to mount the brake rotor 9 to a rotatable axle of the motor vehicle. The annular body 15 extends in a radial direction from the central opening 17 and defines an outer periphery 21 of the brake rotor 9 and first and second friction surfaces 23, 24 disposed on opposite sides of the brake rotor 9. The first and second friction surfaces 23, 24 are configured to engage with brake pads (not shown) disposed on opposite sides of the brake rotor 9 to generate frictional forces that oppose rotation of the brake rotor 9 during braking.

The presently disclosed brake rotor 9 may exhibit other configurations, as will be appreciated by persons of ordinary skill in the art. For example, in some aspects, the hub 11 may be omitted and the brake rotor 9 may be coupled to a rotatable axle of a motor vehicle by other means.

Figure 9:
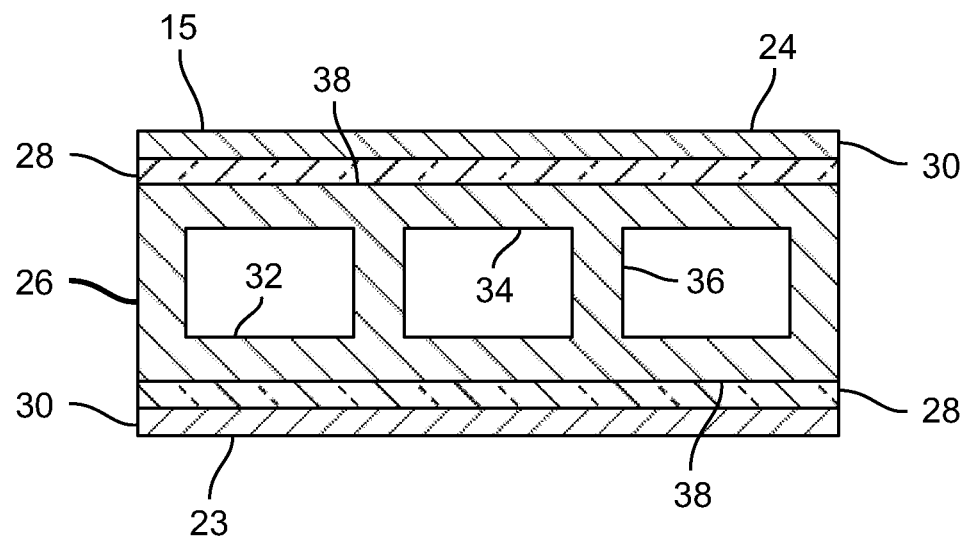
FIG. 9 is schematic cross-sectional view of the annular body of FIG. 8 taken along line 2-2 of FIG. 8, wherein the annular body includes a core, first and second thermal barrier layers disposed on the core, and first and second wear-resistant layers disposed on the core over the first and second thermal barrier layers.

Referring now to FIGS. 8 and 9, the annular body 15 exhibits a composite structure comprising a core 26, first and second thermal barrier layers 28, and first and second wear-resistant layers 30. The core 26 includes at least one annular disc that defines a pair of annular surfaces disposed on opposite sides of the brake rotor 9 and facing away from the core 26. The core 26 depicted in FIGS. 8 and 9 includes a pair of first and second annular discs 32, 34 disposed on opposite sides of the brake rotor 9 and spaced apart from each other in an axial direction by a plurality of ribs 36. Each of the first and second annular discs 32, 34 has an annular surface 38 that faces away from the core 26. The core 26 may have a thickness, measured between the opposite annular surfaces 38, of greater than or equal to about 9 millimeters to less than or equal to about 36 millimeters. The core 26 may be of unitary one-piece construction.

The first and second thermal barrier layers 28 are respectively disposed on the opposite annular surfaces 38 of the core 26 and are configured to inhibit heat transfer from the first and second friction surfaces 23, 24 of the brake rotor 9 to the core 26 during braking. In aspects, the first and second thermal barrier layers 28 may be deposited directly on the opposite annular surfaces 38 of the core 26. The thermal barrier layers 28 may help maintain the core 26 at a temperature of less than about 350° C., even in situations where the temperature of the first and second wear-resistant layers 30 is greater than about 550° C.

The first and second thermal barrier layers 28 may be made of a thermally insulating material having a relatively low thermal conductivity, as compared to the thermal conductivity of the core 26 and the first and second wear-resistant layers 30. For example, the thermal conductivity of the thermally insulating material may be about 5-20% of that of the wear-resistant layers 30.

The thermally insulating material of the thermal barrier layers 28 may comprise a high entropy alloy, a high entropy ceramic, or a combination thereof. A high entropy alloy or ceramic material is an inorganic alloy or ceramic material that (i) comprises at least four elements, with each element being present in the alloy or ceramic at a concentration, on an atomic basis, of greater than or equal to about 5% to less than or equal to about 35%, and/or (ii) exists in the form of a solid solution with no intermetallic phases. Examples of high entropy alloys include bismuth and tellurium (Bi—Te)-based materials and bismuth, antimony, tellurium, and selenium (Bi—Sb—Te—Se)-based materials, e.g., $BiSbTe_{1.5}Se_{1.5}$ and/or $(BiSbTe_{1.5}Se_{1.5})_{1-x}Ag_x$, where x is about 0.9 atomic percent. Examples of high entropy ceramics include zirconate $(Zr_xO_y^{-z})$-based materials and rare earth metal zirconate $(RE_2Zr_2O_7)$-based materials, where RE is $La_2O_3$, $Nd_2O_3$, $Sm_2O_3$, $Eu_2O_3$, $Gd_2O_3$, and/or $Y_2O_3$.

The first and second wear-resistant layers 30 are respectively disposed on the first and second thermal barrier layers 28 and respectively define the first and second friction surfaces 23, 24 of the brake rotor 9. In aspects, the first and second wear-resistant layers 30 may be directly deposited on the first and second thermal barrier layers 28, respectively. The first and second wear-resistant layers 30 are configured to provide the first and second friction surfaces 23, 24 of the 9 with high wear-resistance and excellent thermal stability. For example, the first and second wear-resistant layers 30 may be formulated to exhibit exceptional mechanical stability at high temperatures, e.g., at temperatures of up to about 1,300° C.

In some aspects, the Fe—Al—Si—Zr alloy may comprise a grain refiner. Examples of grain refiners include boride compounds, e.g., chromium(III) boride (CrB) and/or tantalum boride (TaB and/or $TaB_2$). In aspects where the grain refiner comprises chromium(III) boride and tantalum boride, the mass ratio of chromium(III) boride to tantalum boride in the Al—Fe—Si—Zr alloy may be about 1:1. The grain refiner may be present in the Fe—Al—Si—Zr alloy in an amount, by mass, greater than or equal to about 0.05% to less than or equal to about 1% of the Fe—Al—Si—Zr alloy.

Figure 10:
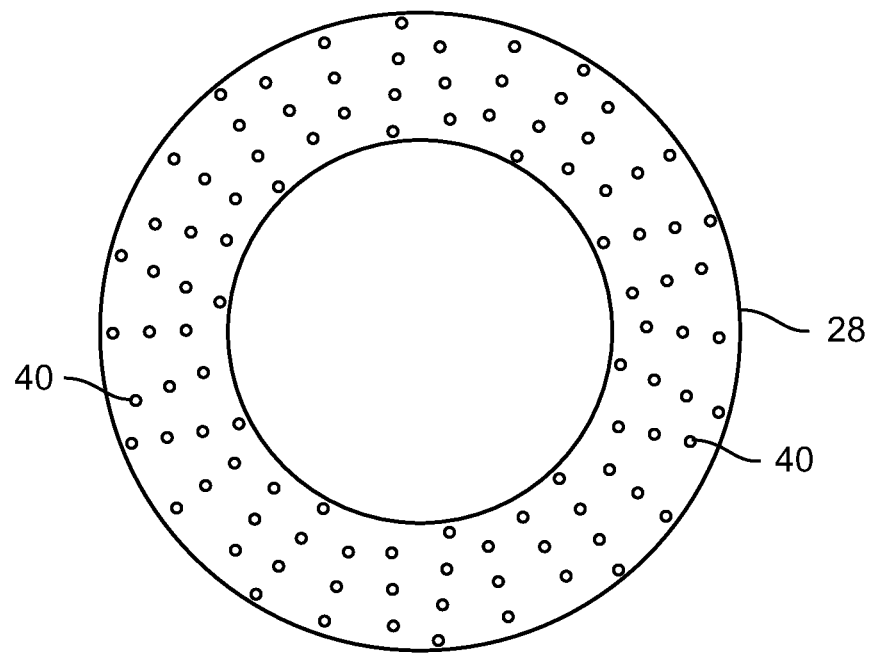
FIG. 10 is schematic cross-sectional view of a thermal barrier layer having a perforated structure and including a plurality of through-holes extending therethrough.
Figure 11:
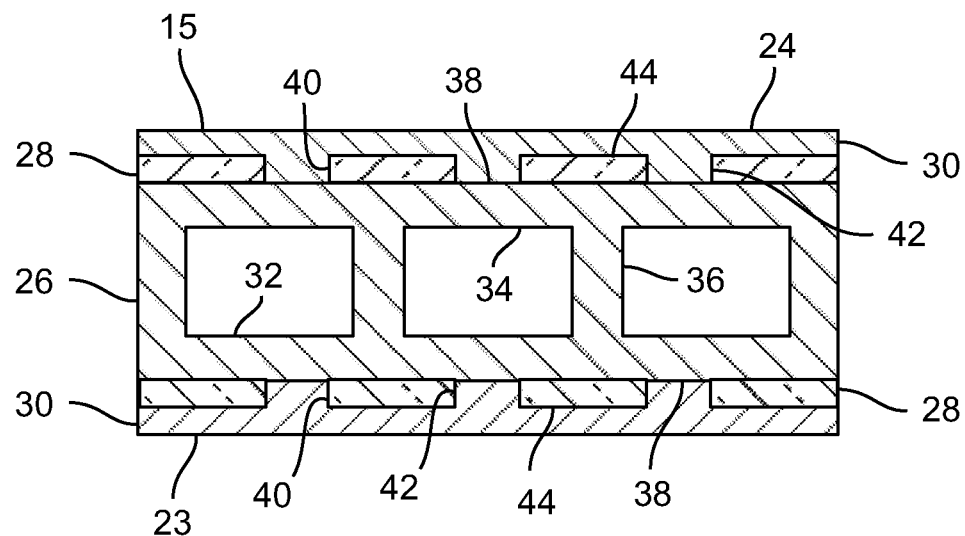
FIG. 11 is schematic cross-sectional view of an annular body of a brake rotor, wherein the annular body includes a core, perforated first and second thermal barrier layers disposed on the core, and first and second wear-resistant layers disposed on the core over the first and second thermal barrier layers, and wherein the first and second wear-resistant layers each include a plurality of anchors that respectively extend from outer surfaces of the first and second thermal barrier layers into the plurality of through-holes in the perforated first and second thermal barrier layers to the core.

Referring now to FIGS. 10 and 11, in some aspects, the first and second thermal barrier layers 28 may be perforated. As shown in FIG. 3, the thermal barrier layers 28 may include a plurality of through-holes 40 extending in an axial direction through the thermal barrier layers 28. In aspects, the through-holes 40 may extend entirely through the thermal barrier layers 28 to the core 26. In such case, as shown in FIG. 11, the first and second wear-resistant layers 30 may each include a plurality of anchors 42 that respectively extend from an outer surface 44 of the first and second thermal barrier layers 28 into the plurality of through-holes 40 in the thermal barrier layers 28 to the annular surfaces 38 of the core 26. In such case, the Fe—Al—Si—Zr alloy of the wear-resistant layers 30 may be metallurgically bonded to the Al—Si alloy of the core 26 via the plurality of anchors 42.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

What is claimed is:

1. A method of manufacturing a brake rotor or brake drum having a composite structure, the method comprising:
    casting an aluminum alloy to form a core of the brake rotor or brake drum, the core defining a core surface;
    depositing a high entropy alloy or yttrium stabilized zirconia on the core surface to form a thermal barrier layer on the core surface; and
    depositing an iron-aluminum-silicon-zirconium alloy on the thermal barrier layer to form a wear-resistant layer on the thermal barrier layer, the wear-resistant layer defining a friction surface of the brake rotor or brake drum.

2. The method of claim 1, wherein depositing the high entropy alloy or yttrium stabilized zirconia includes performing atom layer deposition to deposit the high entropy alloy or yttrium stabilized zirconia on the core surface.

3. The method of claim 2, wherein:
    the atom layer deposition includes a first half-cycle and a second half-cycle;
    the first half-cycle includes a precursor dosing stage and a purge stage; and
    the second half-cycle includes a co-reactant exposure stage and a purge stage.

4. The method of claim 3, further comprising repeating the first half-cycle and the second half-cycle until a thickness of the thermal barrier layer is greater than or equal to a specified threshold thickness.

5. The method of claim 4, wherein the specified threshold thickness is within a range of 35 nanometers to 61 nanometers.

6. The method of claim 4, wherein the specified threshold thickness within a range of 61 nanometers to 138 nanometers.

7. The method of claim 2, wherein a deposition temperature is less than or equal to 250 degrees Celsius.

8. The method of claim 3, wherein the precursor dosing stage includes:
    applying a tetrakis-(dimethylamido) zirconium (Zr(NMe$_2$)$_4$) precursor for zirconia;
    applying a tris-(methylcyclopentadienyl) yttrium precursor for yttrium; and
    applying water as an oxidant for each precursor.

9. The method of claim 1, wherein depositing the high entropy alloy or yttrium stabilized zirconia includes depositing the high entropy alloy to form the thermal barrier layer on the core surface.

10. The method of claim 1, wherein depositing the high entropy alloy or yttrium stabilized zirconia includes depositing the yttrium stabilized zirconia to form the thermal barrier layer on the core surface.

11. The method of claim 1, wherein:
    depositing the yttrium stabilized zirconia includes depositing the yttrium stabilized zirconia in one or more super cycle; and
    each super cycle includes depositing seven cycles of zirconia and depositing one cycle of yttrium.

12. The method of claim 11, wherein a growth rate of the thermal barrier layer is one nanometer per super cycle of deposition.

13. The method of claim 1, wherein depositing the iron-aluminum-silicon-zirconium alloy includes depositing the iron-aluminum-silicon-zirconium alloy on the thermal barrier layer using a directed energy deposition process.

14. The method of claim 1, wherein casting the aluminum alloy includes casting an aluminum-silicon alloy to form the core of the brake rotor or brake drum.

15. The method of claim 1, wherein:
    casting the aluminum alloy includes casting the aluminum alloy to form the core in a shape of a cylindrical body of a brake drum, the cylindrical body defining an inner surface and an outer surface; and
    depositing the high entropy alloy or yttrium stabilized zirconia includes depositing the high entropy alloy or yttrium stabilized zirconia on the inner surface of the cylindrical body.

16. The method of claim 1, wherein:
    casting the aluminum alloy includes casting the aluminum alloy to form the core in a shape of an annular disc of a brake rotor, the annular disc defining at least one annular surface; and
    depositing the high entropy alloy or yttrium stabilized zirconia includes depositing the high entropy alloy or yttrium stabilized zirconia on the at least one annular surface of the annular disc.

17. A method of manufacturing a composite structure for a vehicle braking component, the method comprising:
    casting an aluminum alloy to form a vehicle braking component core, the vehicle braking component core defining a core surface;
    depositing a thermally insulating material directly on the core surface of the vehicle braking component core to form a thermal barrier layer; and
    depositing an iron-aluminum-silicon-zirconium alloy on the thermal barrier layer to form a wear-resistant layer on the thermal barrier layer, the wear-resistant layer defining a friction surface of the vehicle braking component.

18. The method of claim 17, wherein depositing the thermally insulating material includes depositing the thermally insulating material using an atom layer deposition process.

19. A vehicle braking component having a composite structure, the vehicle braking component comprising:
    a vehicle braking component core including an aluminum alloy, the vehicle braking component core defining a core surface;
    a thermally insulating material on the core surface of the vehicle braking component core, the thermally insulating material defining a thermal barrier layer, a thickness of the thermally insulating material being in a range between 50 and 100 nanometers, and the thermally insulating material including a high entropy alloy or yttrium stabilized zirconia deposited on the core surface at least partially by a process other than atomic layer deposition (ALD); and
    a wear-resistant layer on the thermal barrier layer, the wear-resistant layer comprising an iron-aluminum-silicon-zirconium alloy, and the wear-resistant layer defining a friction surface of the vehicle braking component.

20. The vehicle braking component of claim 19, wherein the process other than atomic layer deposition is a physical vapor deposition process.

* * * * *